(12) United States Patent
Stiebler

(10) Patent No.: US 8,222,949 B2
(45) Date of Patent: Jul. 17, 2012

(54) BALANCED SWITCH INCLUDING SERIES, SHUNT, AND RETURN TRANSISTORS

(75) Inventor: Wolfram Stiebler, Munich (DE)

(73) Assignee: Triquint Semiconductor, Inc., Hillsboro, OR (US)

( * ) Notice: Subject to any disclaimer, the term of this patent is extended or adjusted under 35 U.S.C. 154(b) by 113 days.

(21) Appl. No.: 12/832,911

(22) Filed: Jul. 8, 2010

(65) Prior Publication Data

US 2012/0007658 A1    Jan. 12, 2012

(51) Int. Cl.
    *H03K 17/687* (2006.01)
(52) U.S. Cl. ......... 327/427; 327/430; 327/436; 327/437
(58) Field of Classification Search .......... 327/427, 327/430, 436–437
    See application file for complete search history.

(56) References Cited

U.S. PATENT DOCUMENTS

| | | | | |
|---|---|---|---|---|
| 4,810,911 A * | 3/1989 | Noguchi | | 327/431 |
| 4,891,536 A | 1/1990 | Fox | | |
| 5,812,939 A * | 9/1998 | Kohama | | 455/78 |
| 5,818,283 A | 10/1998 | Tonami | | |
| 6,642,578 B1 | 11/2003 | Arnold | | |
| 7,221,207 B2 * | 5/2007 | Fukumoto et al. | | 327/365 |
| 7,675,382 B2 * | 3/2010 | Deng et al. | | 333/103 |
| 2005/0231439 A1 | 10/2005 | Suwa | | |

OTHER PUBLICATIONS

Examination Report issued by UK IPO in British Patent Application No. GB1110818.0 dated Oct. 14, 2011.

* cited by examiner

*Primary Examiner* — Kenneth B. Wells
(74) *Attorney, Agent, or Firm* — Schwabe Williamson & Wyatt

(57) ABSTRACT

Embodiments of circuits, devices, and methods related to a radio frequency switch are disclosed. In various embodiments, a circuit may comprise a series path including a series transistor to be switched on during a first mode of operation; a shunt path including a shunt transistor to be switched off during the first mode of operation; and a return path including a return transistor to be switched on during the first mode of operation. Other embodiments may also be described and claimed.

19 Claims, 6 Drawing Sheets

BALANCED SWITCH INCLUDING SERIES, SHUNT, AND RETURN TRANSISTORS

FIELD

Embodiments of the present disclosure relate generally to the field of circuits, and more particularly to balanced switches.

BACKGROUND

A switch, which is used in radio frequency (RF) applications, generally includes one or more shunt devices in one or more shunt paths. Blocking capacitors are generally used in the shunt paths to improve performance of the switch and to block direct current (DC), which may be used for biasing active devices of the switch, from being transmitted in RF signal transmission paths. Such blocking capacitors may counter the effectiveness of the shunt paths, and also require additional chip area.

BRIEF DESCRIPTION OF THE DRAWINGS

Embodiments are illustrated by way of example and not by way of limitation in the figures of the accompanying drawings, in which like references indicate similar elements.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in various embodiments" is used repeatedly. The phrase generally does not refer to the same embodiments; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

As used herein, "coupled with" may mean either one or both of the following: a direct coupling or connection, where there is no other element coupled or connected between the elements that are said to be coupled with each other; or an indirect coupling or connection, where one or more other elements are coupled or connected between the elements that are said to be coupled with each other.

Figure 1:
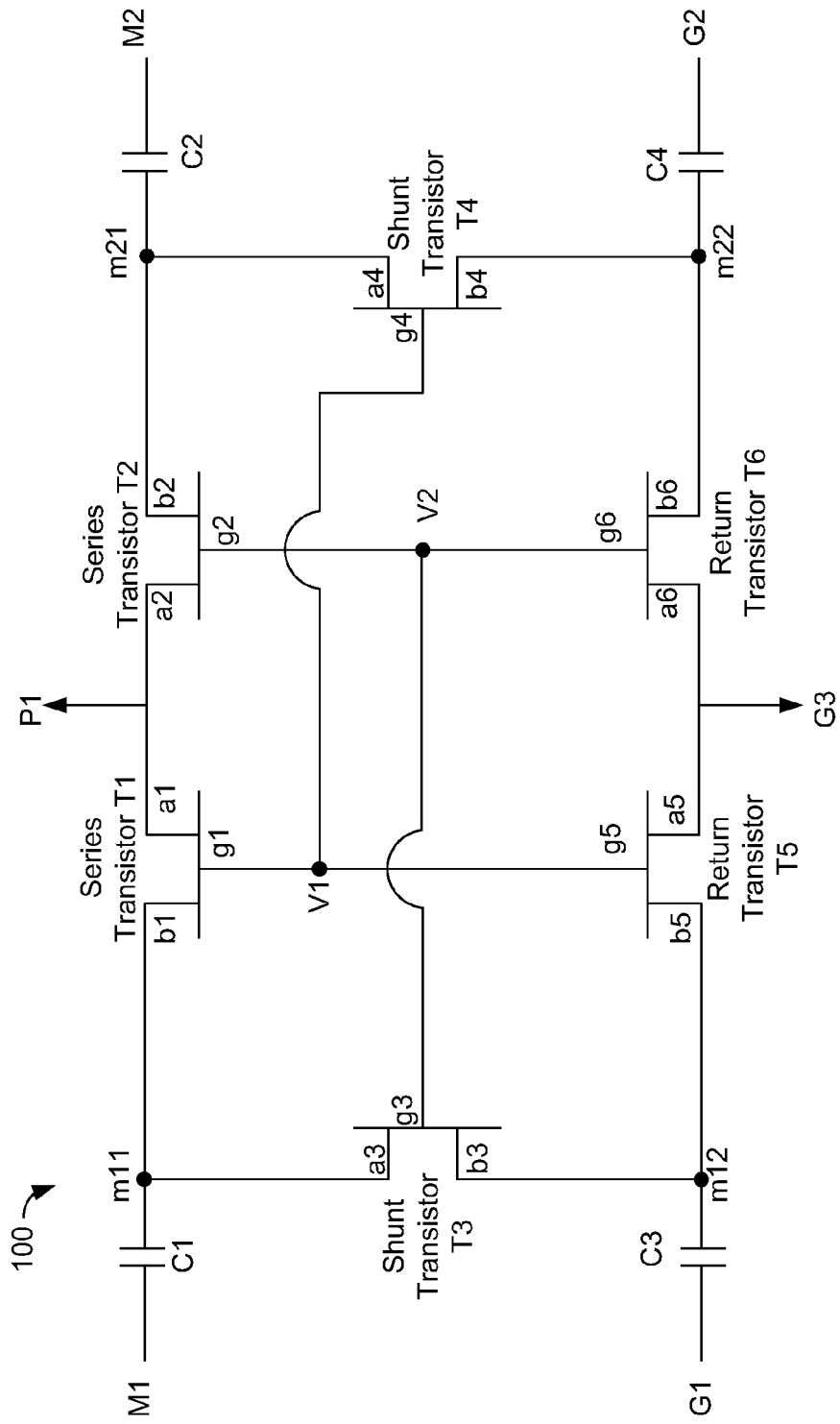
FIG. 1 schematically illustrates a circuit, in accordance with various embodiments of the present disclosure.

FIG. 1 schematically illustrates a circuit 100, in accordance with various embodiments of the present disclosure. In various embodiments, the circuit 100 may be a switch, e.g., a single-pole double-throw (SPDT) switch. The circuit 100 includes terminals P1, M1 and M2. The circuit 100 also includes terminals G1, G2 and G3, one or more of which may be electrically coupled with respective ground terminals. The terminals G1, G2 and G3 may also be referred to herein as ground terminals G1, G2 and G3.

In various embodiments, the circuit 100 may be configured such that the terminal P1 is selectively electrically coupled with the terminal M1 or with the terminal M2, and terminal G3 is selectively electrically coupled with the terminal G1 or with the terminal G2, based at least in part on a mode of operation of the circuit 100. For example, during a first mode of operation, terminals P1 and G3 may be electrically coupled with the terminals M1 and G1, respectively; and during a second mode of operation, terminals P1 and G3 may be electrically coupled with the terminals M2 and G2, respectively, as will be discussed in more detail herein later.

The circuit 100 further includes control terminals V1 and V2. In various embodiments, the mode of operation of the circuit 100 may be based at least in part on voltage levels of the control terminals V1 and V2.

The circuit 100 comprises series transistors T1 and T2, shunt transistors T3 and T4, and return transistors T5 and T6. These transistors may be of any appropriate type. For example, in various embodiments, one or more of the transistors T1-T6 may be field effect transistors (FETs), e.g., n-channel FETs. In various embodiments, one or more of the transistors T1-T6 may comprise, for example, one or more layers that are formed using a Gallium Arsenide (GaAs) compound.

The series transistor T1 may be electrically coupled between terminal P1 and a node m11. For example, a terminal a1 of the series transistor T1 may be electrically coupled with the terminal P1, and a terminal b1 of the series transistor T1 may be electrically coupled with the node m11. In various embodiments, the terminal a1 may be a source terminal, and the terminal b1 may be a drain terminal of the series transistor T1; or the terminal a1 may be the drain terminal, and the terminal b1 may be the source terminal of the series transistor T1. A gate terminal g1 of the series transistor T1 may be electrically coupled with the control terminal V1. A capacitor C1 may be electrically coupled between node m11 and terminal M1.

The shunt transistor T3 may be electrically coupled between node m11 and a node m12. For example, a terminal a3 of the shunt transistor T3 may be electrically coupled with node m11, and a terminal b3 of the shunt transistor T3 may be electrically coupled with node m12. In various embodiments, the terminal a3 may be a source terminal, and the terminal b3 may be a drain terminal of the shunt transistor T3; or the terminal a3 may be the drain terminal, and the terminal b3 may be the source terminal of the shunt transistor T3. A gate terminal g3 of the shunt transistor T3 may be electrically coupled with the control terminal V2. A capacitor C3 may be electrically coupled between node m12 and terminal G1.

The return transistor T5 may be electrically coupled between terminal G3 and the node m12. For example, a terminal a5 of the return transistor T5 may be electrically coupled with terminal G3, and a terminal b5 of the return transistor T5 may be electrically coupled with node m12. In various embodiments, the terminal a5 may be a source terminal, and the terminal b5 may be a drain terminal of the return transistor T5; or the terminal a5 may be the drain terminal, and the terminal b5 may be the source terminal of the return transistor T5. A gate terminal g5 of the return transistor T5 may be electrically coupled with the control terminal V1.

The series transistor T2 may be electrically coupled between terminal P1 and a node m21. For example, a terminal a2 of the series transistor T2 may be electrically coupled with the terminal P1, and a terminal b2 of the series transistor T2 may be electrically coupled with the node m21. In various embodiments, the terminal a2 may be a source terminal, and the terminal b2 may be a drain terminal of the series transistor T2; or the terminal a2 may be the drain terminal, and the terminal b2 may be the source terminal of the series transistor T2. A gate terminal g2 of the series transistor T2 may be electrically coupled with the control terminal V2. A capacitor C2 may be electrically coupled between node m21 and terminal M2.

The shunt transistor T4 may be electrically coupled between node m21 and a node m22. For example, a terminal a4 of the shunt transistor T4 may be electrically coupled with node m21, and a terminal b4 of the shunt transistor T4 may be electrically coupled with node m22. In various embodiments, the terminal a4 may be a source terminal, and the terminal b4 may be a drain terminal of the shunt transistor T4; or the terminal a4 may be the drain terminal, and the terminal b4 may be the source terminal of the shunt transistor T4. A gate terminal g4 of the shunt transistor T4 may be electrically coupled with the control terminal V1. A capacitor C4 may be electrically coupled between node m22 and terminal G2.

The return transistor T6 may be electrically coupled between terminal G3 and the node m22. For example, a terminal a6 of the return transistor T6 may be electrically coupled with terminal G3, and a terminal b6 of the return transistor T6 may be electrically coupled with node m22. In various embodiments, the terminal a6 may be a source terminal, and the terminal b6 may be a drain terminal of the return transistor T6; or the terminal a6 may be the drain terminal, and the terminal b6 may be the source terminal of the return transistor T6. A gate terminal g6 of the return transistor T6 may be electrically coupled with the control terminal V2.

In various embodiments, a circuit segment between the terminals P1 and M1 is herein also referred to as a first series path; a circuit segment between the terminals P1 and M2 is herein also referred to as a second series path; a circuit segment between nodes m11 and m12 is herein also referred to as a first shunt path; a circuit segment between nodes m21 and m22 is herein also referred to as a second shunt path; a circuit segment between terminals G1 and G3 is herein also referred to as a first return path; and a circuit segment between terminals G2 and G3 is herein also referred to as a second return path.

Although not illustrated in FIG. 1, the circuit 100 may also include several other active and/or passive devices. For example, in various embodiments, although not illustrated in FIG. 1, one or more resistors may be electrically coupled with gate terminals of one or more transistors of the circuit 100. These resistors may be used, for example, to facilitate operation of the associated transistors in a passive mode.

During the first mode of operation of the circuit 100 (hereinafter referred to as the first mode), a voltage at control terminal V1 may be high as compared to a voltage at control terminal V2. For example, the voltage at control terminal V1 may be sufficiently high to switch on the series transistor T1, the return transistor T5, and the shunt transistor T4. Also, the voltage at control terminal V2 may be, for example, sufficiently low to switch off the series transistor T2, the return transistor T6, and the shunt transistor T3. In various embodiments, during the first mode, the control terminal V2 may be electrically coupled with a ground terminal.

Thus, during the first mode, series transistor T1, return transistor T5, and shunt transistor T4 may be switched on; and series transistor T2, return transistor T6, and the shunt transistor T3 may be switched off.

In various embodiments, during the first mode, switching on of the series transistor T1 and return transistor T5 may result in an electrical coupling of the terminal P1 with the terminal M1, and in an electrical coupling of the terminal G1 with the terminal G3, respectively. The capacitor C1 may block any DC current, e.g., DC biasing current, from transmitting between terminal P1 and terminal M1, but may allow transmission of RF signals between terminals P1 and M1. Similarly, the capacitor C3 may block any DC current, e.g., DC biasing current, from transmitting between terminal G1 and terminal G3, but may allow transmission of RF signals between terminals G1 and G3.

On the other hand, switching off of the series transistor T2 may result in electrical isolation between the terminals P1 and M2. Also, switching off of the shunt transistor T3 may result in electrical isolation between the node m11 and node m12, thereby increasing the electrical isolation between terminal M1 and ground terminal G1. Also, switching on of the shunt transistor T4 may result in the terminal M2 being electrically coupled with the ground terminal G2. Thus, during the first mode of operation, RF signals may be transmitted from terminals P1 and/or G3 to terminals M1 and/or G1, respectively. Additionally or alternatively, during the first mode of operation, RF signals may also be transmitted from terminals M1 and/or G1 to terminals P1 and/or G3, respectively.

Figure 2:
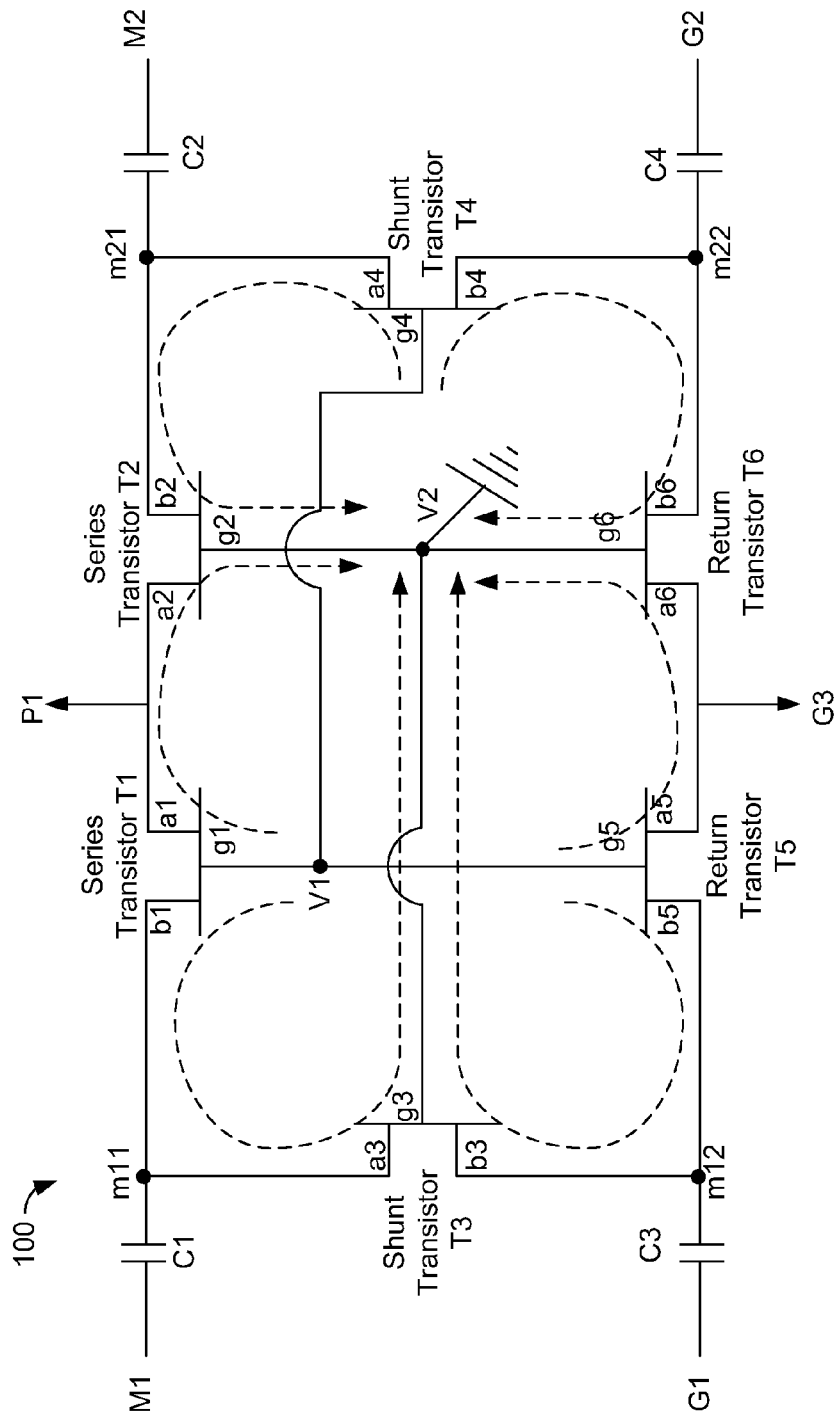
FIG. 2 schematically illustrates the circuit of FIG. 1 with transmission paths of gate currents of various transistors during a first mode of operation of the circuit, in accordance with various embodiments of the present disclosure.

In various embodiments, during the first mode, switching on the transistors T1, T5 and T4 may result in generation of respective gate currents in respective gate terminals. FIG. 2 schematically illustrates the circuit 100 of FIG. 1 with transmission paths (illustrated by dotted lines) of gate currents of various transistors during the first mode of operation of the circuit 100, in accordance with various embodiments of the present disclosure. For example, gate current generated in the gate terminal g1 of series transistor T1 may be transmitted through the terminals a1 and/or b1, as illustrated in FIG. 2. A portion of the gate current of series transistor T1, which flows from terminal g1 to terminal b1, may be prevented from reaching terminal M1 by the blocking capacitor C1. Also, the a3-g3 junction in the shunt transistor T3 is reverse biased, as the voltage of the control terminal V2 is relatively low and the shunt transistor T3 is off. Accordingly, the portion of the gate current of series transistor T1, which flows from terminal g1 to terminal b1, may be transmitted from terminal a3, through gate terminal g3, to the control terminal V2, as illustrated in FIG. 2. Furthermore, in various embodiments, during the first mode, the control terminal V2 may be grounded (e.g., as illustrated in FIG. 2), and accordingly, a portion of the gate current of series transistor T1, reaching control terminal V2 via terminals a3 and g3 of shunt transistor T3, may be grounded via the control terminal V2.

Similarly, during the first mode, a portion of the gate current of series transistor T1, which flows from terminal g1 to terminal a1, reaches terminal a2 of the series transistor T2. Also, the a2-g2 junction in the series transistor T2 may be reverse biased, as the voltage of the control terminal V2 is relatively low and the series transistor T2 is off. Accordingly, the portion of the gate current of series transistor T1, which flows from terminal g1 to terminal a1, may be grounded through terminal a2, gate terminal g2, and control terminal V2, as illustrated in FIG. 2.

During the first mode, gate current generated in the gate terminal g5 of return transistor T5 may be transmitted through the terminals a5 and/or b5. A portion of the gate current of return transistor T5, which flows from terminal g5 to terminal b5, may be prevented from reaching terminal G1 by the blocking capacitor C3. Also, the b3-g3 junction in the shunt transistor T3 may be reverse biased, as the voltage of the control terminal V2 is relatively low and the shunt transistor T3 is off. Accordingly, the portion of the gate current of return transistor T5, which flows from terminal g5 to terminal b5, may be grounded through terminal b3, gate terminal g3, and control terminal V2, as illustrated in FIG. 2.

Also, during the first mode, a portion of the gate current of return transistor T5, which flows from terminal g5 to terminal a5, reaches terminal a6 of the return transistor T6. Also, the a6-g6 junction may be reverse biased, as the voltage of the control terminal V2 is relatively low, and the return transistor T6 is off. Accordingly, a portion of the gate current of return transistor T5, which flows from terminal g5 to terminal a5, may reach the ground terminal through terminal a6, gate terminal g6, and control terminal V2, as illustrated in FIG. 2.

Similarly, during the first mode of operation, a portion of the gate current generated in the gate terminal g4 of shunt transistor T4 may be prevented from reaching terminals M2 and G2 by the blocking capacitors C2 and C4, respectively. A portion of the gate current of shunt transistor T4, which flows from terminal g4 to terminal a4, may be grounded through terminal b2, gate terminal g2, and control terminal V2, as illustrated in FIG. 2. Another portion of the gate current of shunt transistor T4, which flows from terminal g4 to terminal b4, may be grounded through terminal b6 of return transistor T6, gate terminal g6 of return transistor T6, and the control terminal V2, as illustrated in FIG. 2.

In various embodiments, during the second mode of operation of the circuit 100 (hereinafter referred to as the second mode), a voltage at control terminal V2 may be high as compared to a voltage at control terminal V1. For example, the voltage at control terminal V2 may be sufficiently high to switch on the series transistor T2, the return transistor T6, and the shunt transistor T3. Also, the voltage at control terminal V1 may be, for example, sufficiently low to switch off the series transistor T1, the return transistor T5, and the shunt transistor T4. In various embodiments, the control terminal V1 may be electrically coupled with a ground terminal during the second mode.

Thus, during the second mode, series transistor T1, return transistor T5, and shunt transistor T4 may be switched off; and series transistor T2, return transistor T6, and the shunt transistor T3 may be switched on.

In various embodiments, during the second mode, switching on of the series transistor T2 and return T6 may result in an electrical coupling of the terminal P1 with the terminal M2, and in an electrical coupling of the terminal G3 with the terminal G2, respectively. The capacitor C2 may block any DC current, e.g., DC biasing current, from transmitting between terminal P1 and terminal M2, but may allow transmission of RF signals between terminals P1 and M2. Similarly, the capacitor C4 may block any DC current, e.g., DC biasing current, from transmitting between terminal G3 and terminal G2, but may allow transmission of RF signals between terminals G3 and G2. On the other hand, switching off of the series transistor T1 may result in electrical isolation between the terminals P1 and M1. Also, switching off of the shunt transistor T4 may result in electrical isolation between the node m21 and node m22, thereby increasing the electrical isolation between terminal M2 and ground terminal G2. Furthermore, switching on of the shunt transistor T3 may result in the terminal M1 being electrically coupled with the ground terminal G1. Thus, during the second mode of operation, RF signals may be transmitted from terminals P1 and/or G3 to terminals M2 and/or G2, respectively. Additionally or alternatively, during the second mode of operation, RF signals may be transmitted from terminals M2 and/or G2 to terminals P1 and/or G3, respectively.

Figure 3:
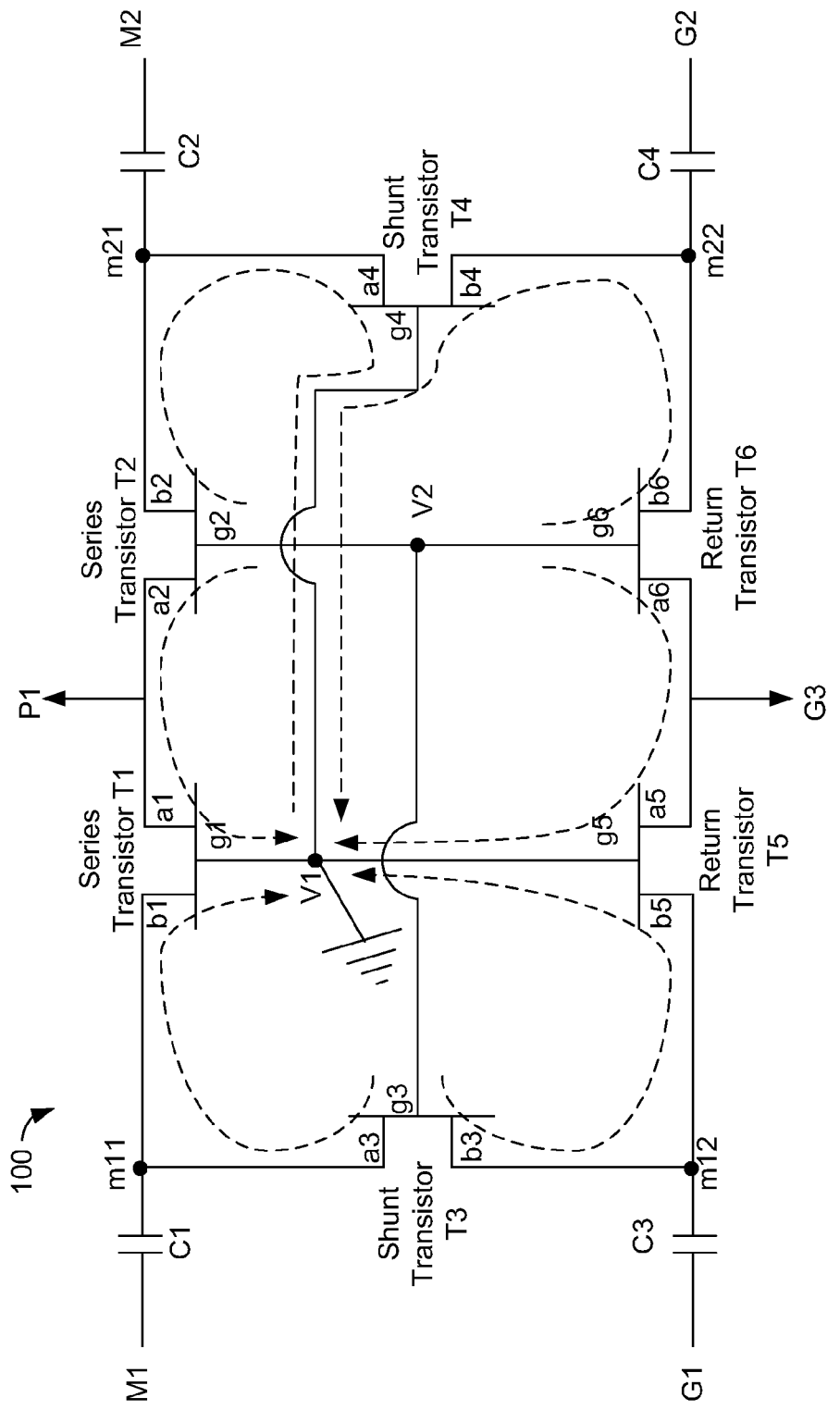
FIG. 3 schematically illustrates the circuit of FIG. 1 with transmission paths of gate currents of various transistors during a second mode of operation of the circuit, in accordance with various embodiments of the present disclosure.

In various embodiments, during the second mode of operation, switching on the transistors T2, T6 and T3 may result in generation of respective gate currents in respective gate terminals. FIG. 3 schematically illustrates the circuit 100 of FIG. 1 with transmission paths (illustrated by dotted lines) of gate currents of various transistors during the second mode of operation of the circuit 100, in accordance with various embodiments of the present disclosure.

In various embodiments, during the second mode of operation, a portion of the gate current of series transistor T2, which flows from terminal g2 to terminal b2, may be prevented from reaching terminal M2 by the blocking capacitor C2. Also, a portion of the gate current of series transistor T2, which flows from terminal g2 to terminal b2, may be grounded through terminal a4 of shunt transistor T4, gate terminal g4 of the shunt transistor T4, and control terminal V1. Another portion of the gate current of series transistor T2, which flows from terminal g2 to terminal a2, may be grounded through terminal a1 of the series transistor T1, gate terminal g1 of the series transistor T1, and the control terminal V1, as illustrated in FIG. 3.

Also, during the second mode of operation, a portion of the gate current of return transistor T6, which flows from terminal g6 to terminal b6, may be grounded through terminal b4 of the shunt transistor T4, gate terminal g4 of the shunt transistor T4, and the control terminal V1, as illustrated in FIG. 3. Another portion of the gate current of return transistor T6, which flows from terminal g6 to terminal a6, may be grounded through terminal a5 of the return transistor T5, gate terminal g5 of the return transistor T5, and the control terminal V1, as illustrated in FIG. 3.

Also, during the second mode of operation, a portion of the gate current generated in the gate terminal g3 of shunt transistor T3 may be prevented from reaching terminals M1 and G1 by the blocking capacitors C1 and C3, respectively. A portion of the gate current of shunt transistor T3, which flows from terminal g3 to terminal a3, may be grounded through terminal b1 of the series transistor T1, gate terminal g1 of the series transistor T1, and the control terminal V1. Another portion of the gate current of shunt transistor T3, which flows from terminal g3 to terminal b3, may be grounded through terminal b5 of the return transistor T5, gate terminal g5 of return transistor T5, and the control terminal V1, as illustrated in FIG. 3.

Figure 4:
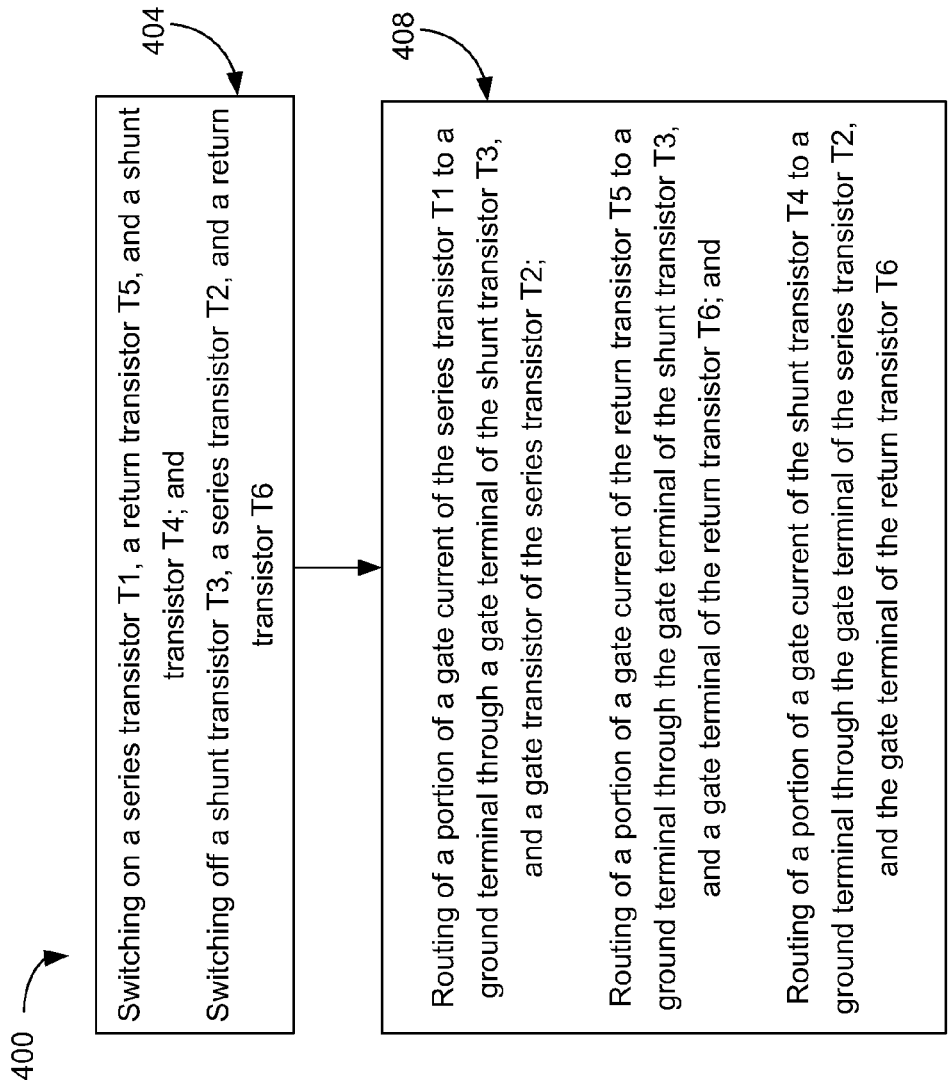
FIG. 4 illustrates an example method for operating the circuit of FIGS. 1-3 in the first mode of operation, in accordance with various embodiments of the present disclosure.

FIG. 4 illustrates an example method 400 for operating the circuit 100 of FIGS. 1-2 in the first mode of operation, in accordance with various embodiments of the present disclosure. Referring to FIGS. 1, 2 and 4, at 404, during the first mode of operation, the series transistor T1, the return transistor T5, and the shunt transistor T4 are switched on. Also, at 404, the shunt transistor T3, the series transistor T2, and the return transistor T6 are switched off. Such switching of the transistors T1-T6 is performed by appropriately controlling the voltage levels of the control terminals V1 and V2. In various embodiments, such switching of the transistors T1-T6 may result in transmission of RF signals between terminals P1 and M1, while DC current, e.g., gate current of transistor T1 may be blocked from being transmitted to terminal M1.

As a result of such switching of the transistors, at 408, a portion of a gate current of the series transistor T1 is routed to a ground terminal, e.g., via the control terminal V2, through a gate terminal g3 of the shunt transistor T3, and a gate terminal g2 of the series transistor T5. Also, at 408, a portion of a gate current of the return transistor T5 is routed to a ground terminal, e.g., via the control terminal V2, through the gate terminal g3 of the shunt transistor T3, and a gate terminal g6 of the return transistor T6. Also, at 408, a portion of a gate current of the shunt transistor T4 is routed to a ground terminal, e.g., via control terminal V2, through the gate terminal g2 of the series transistor T2, and the gate terminal g6 of the return transistor T6.

Figure 5:
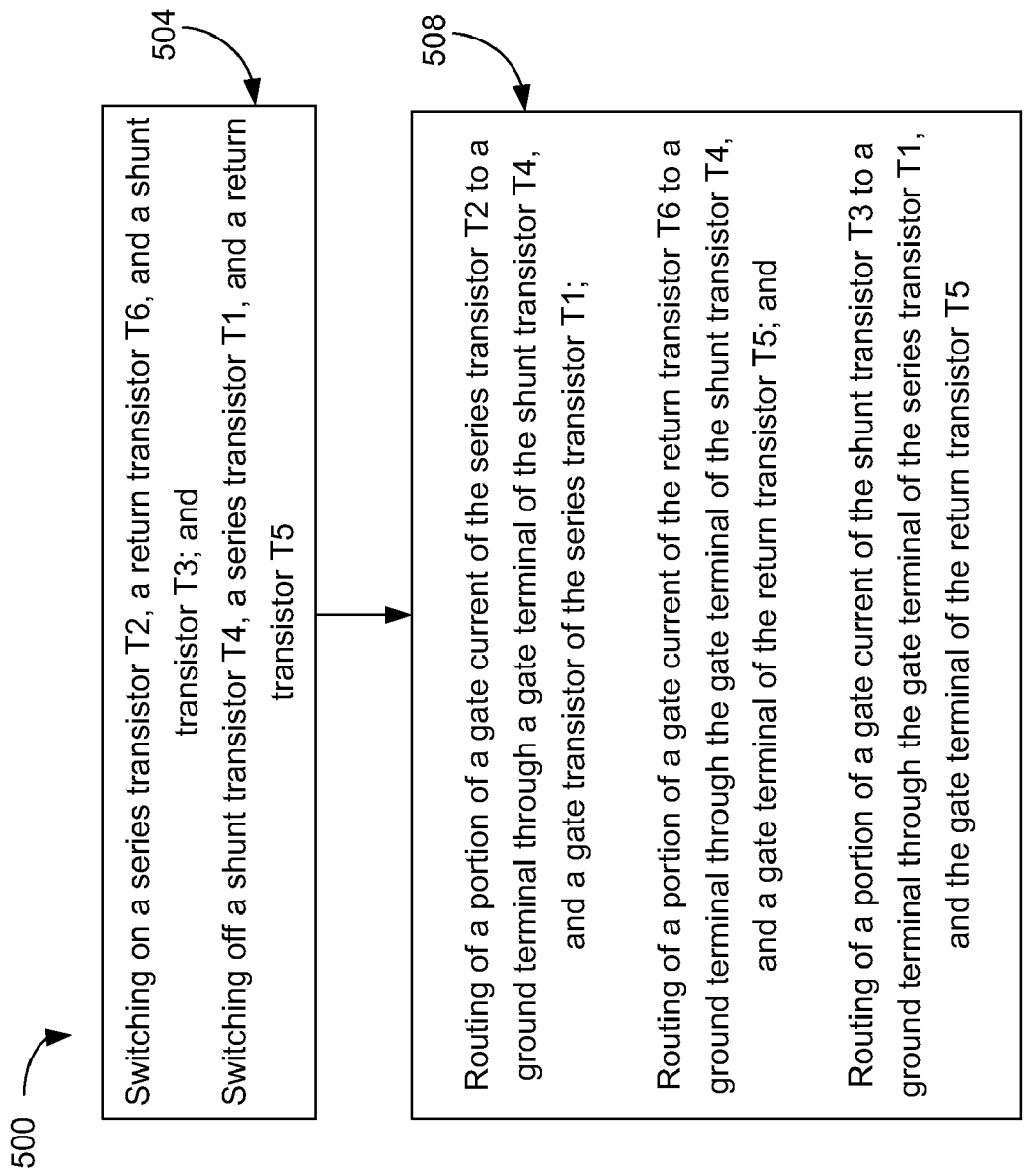
FIG. 5 illustrates an example method for operating the circuit of FIGS. 1-3 in the second mode of operation, in accordance with various embodiments of the present disclosure.

FIG. 5 illustrates an example method 500 for operating the circuit 100 of FIGS. 1 and 3 in the second mode of operation, in accordance with various embodiments of the present disclosure. Referring to FIGS. 1, 3 and 5, at 504, during the second mode of operation, the series transistor T2, the return transistor T6, and the shunt transistor T3 are switched on. Also, at 504, the shunt transistor T4, the series transistor T1, and the return transistor T5 are switched off. Such switching of the transistors T1-T6 is performed by appropriately controlling the voltage levels of the control terminals V1 and V2. In various embodiments, such switching of the transistors T1-T6 may result in transmission of RF signals between terminals P1 and M2, while DC current, e.g., gate current of transistor T2 may be blocked from being transmitted to terminal M2.

As a result of such switching of the transistors, at 508, a portion of a gate current of the series transistor T2 is routed to a ground terminal, e.g., via the control terminal V1, through a gate terminal g4 of the shunt transistor T4, and a gate terminal g1 of the series transistor T1. Also, at 408, a portion of a gate current of the return transistor T6 is routed to a ground terminal, e.g., via the control terminal V1, through the gate terminal g4 of the shunt transistor T4, and a gate terminal g5 of the return transistor T5. Also, at 508, a portion of a gate current of the shunt transistor T3 is routed to a ground terminal, e.g., via control terminal V1, through the gate terminal g1 of the series transistor T1, and the gate terminal g5 of the return transistor T5.

In various embodiments, the circuit 100 of FIGS. 1-3 may be a balanced circuit. For example, in various embodiments, terminals P1, M1 and M2 may be interchanged with terminals G3, G1 and G2, respectively, without impacting the performance of the circuit 100. Similarly, in various embodiments, terminals M1 and G1 may be interchanged with terminals M2 and G2, respectively, without impacting the performance of the circuit 100. Due to such a balanced nature, the circuit 100 may be used for balanced differential mode operation.

Although the circuit 100 is a SPDT switch, the inventive principles of this disclosure may be extended to a single-pole plural-throw switch (e.g., a single-pole triple-throw switch, a single-pole four-throw switch, etc.). Such switches may have multiple series paths, shunt paths, and return paths, based at least in part on a number of throws of the switch.

The circuit 100 of FIGS. 1-3 and methods 400 and 500 of operating the circuit 100 have several advantages over a conventional switching circuit used for switching RF signals. For example, a conventional SPDT switch includes capacitors in shunt paths and/or parallel to the shunt paths, to ensure proper biasing of the shunt transistors while blocking DC biasing current from reaching RF-only sections of the switch. However, the structure of the switch 100 provides a proper path for routing DC biasing signals, thereby obviating a need for such additional capacitors associated with shunt paths. Accordingly, the switch 100 may have relatively less off-capacitance in the series and shunt paths, improved isolation in the shunt paths, and lower insertion loss, as compared to a conventional switch. Furthermore, the switch 100 may require relatively less chip area compared to a conventional switch, as a result of having fewer capacitors compared to the conventional switch.

Figure 6:
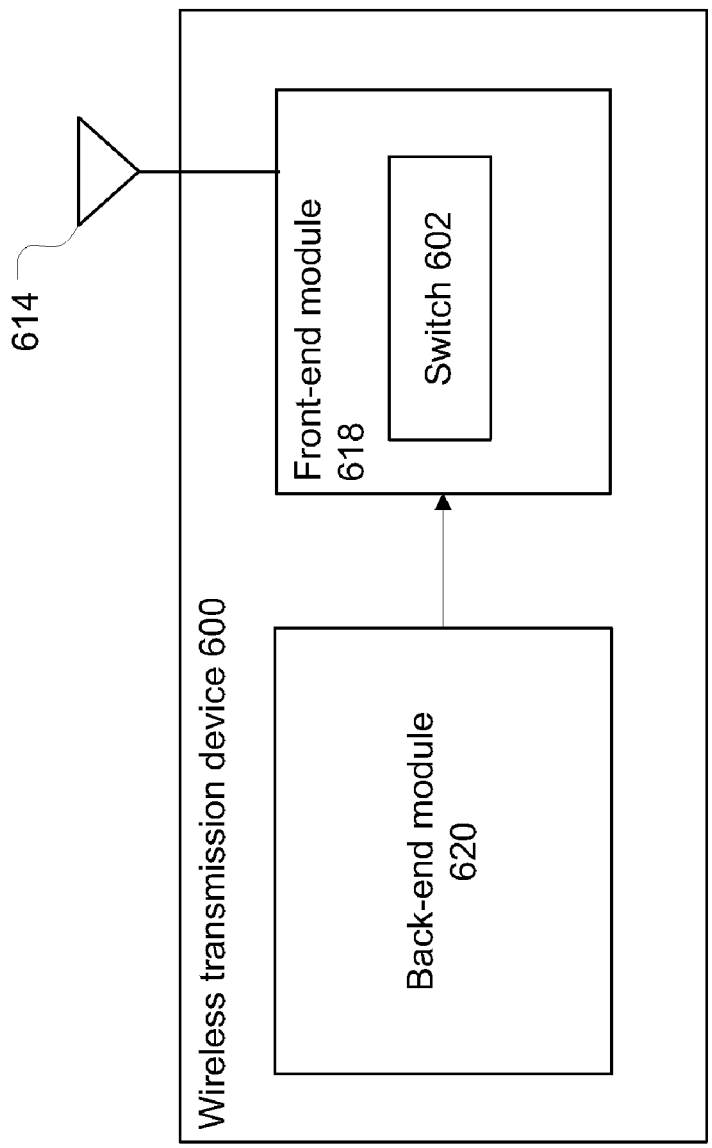
FIG. 6 illustrates a block diagram of an exemplary wireless transmission device incorporating the circuit of FIGS. 1-3.

In various embodiments, the circuit 100 of FIGS. 1-3 may be configured to route RF power in multifunction power amplifiers, modules, front-end switches for radio applications (such as cellular phones and mobile devices), and/or the like. The circuit 100 of FIGS. 1-3 may be incorporated into any of a variety of apparatuses and systems. A block diagram of an exemplary wireless transmission device 600 incorporating the circuit 100 (represented as switch 602) is illustrated in FIG. 6. The wireless transmission device 600 may have a front-end module 618 coupled with an antenna structure 614, and a back-end module 620. In various embodiments, the wireless transmission device 600 may have transmitting and/or receiving capabilities.

In various embodiments, the wireless transmission device 600 may be, but is not limited to, a mobile telephone, a paging device, a personal digital assistant, a text-messaging device, a portable computer, a desktop computer, a telecommunications base station, a subscriber station, an access point, a radar, a satellite communication device, or any other device capable of wirelessly transmitting RF signals.

In various embodiments, the front-end module 618 may receive outgoing data (e.g., voice data, web data, e-mail, signaling data, etc.) from the back-end module 620, may generate an RFout signal to represent the outgoing data, may amplify the generated signal, and/or may forward the amplified signal to the antenna structure 614 (e.g., through a duplexer) for an over-the-air (OTA) transmission.

In a similar manner, the front-end module may receive an incoming OTA signal from the antenna structure 614 (e.g., through the duplexer). The front-end module 618 may also process and send the incoming signal to the back-end module 620 for further processing. The front-end module 618 may also perform one or more other operations associated with front-end processing of RF signals.

In various embodiments, the antenna structure 614 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The back-end module 620 may perform one or more back end operations of the wireless transmission device 600. For example, the back-end module 620 may control and/or process RF signals received by, and/or transmitted from the front-end module 618.

In various embodiments, the switch 602 may be associated with, or included in, any of the components of the front-end module 618. For example, although not illustrated in FIG. 6, in various embodiments, the switch 602 may be associated with, or included in, a duplexer included in the front-end module 618, and may be configured to selectively switch RF signals from or to the antenna structure 614. In various other embodiments, although not illustrated in FIG. 6, the switch 602 may be associated with, or included in, a transmitter, an amplifier, and/or a receiver of the front-end module 618.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
 a series path including a series transistor to be switched on during a first mode of operation;
 a shunt path including a shunt transistor to be switched off during the first mode of operation; and
 a return path including a return transistor to be switched on during the first mode of operation;
 wherein during the first mode of operation, a portion of a gate current of the series transistor reaches a control terminal through a gate terminal of the shunt transistor, and a portion of a gate current of the return transistor reaches the control terminal through the gate terminal of the shunt transistor.

2. The circuit of claim 1,
 wherein during the first mode of operation, the control terminal is grounded.

3. The circuit of claim 1, wherein the control terminal comprises a first control terminal, and wherein a gate terminal of the series transistor and a gate terminal of the return transistor are electrically coupled with a second control terminal.

4. The circuit of claim 1, wherein the gate terminal of the shunt transistor is electrically coupled with the control terminal.

5. The circuit of claim 1, wherein the gate current of the series transistor reaches the control terminal through a first terminal of the shunt transistor and through the gate terminal of the shunt transistor; and wherein the gate current of the return transistor reaches the control terminal through a second terminal of the shunt transistor and through the gate terminal of the shunt transistor.

6. The circuit of claim 1, wherein the series path comprises a first series path, the series transistor comprises a first series transistor, the shunt path comprises a first shunt path, the shunt transistor comprises a first shunt transistor, the return path comprises a first return path, and the return transistor comprises a first return transistor, the circuit further comprising:
 a second series path including a second series transistor to be turned off during the first mode of operation;
 a second shunt path including a second shunt transistor to be turned on during the first mode of operation; and
 a second return path including a second return transistor to be turned off during the first mode of operation;
 wherein during the first mode of operation, a portion of a gate current of the second shunt transistor reaches the control terminal through a gate terminal of the second series transistor, and through a gate terminal of the second return transistor.

7. The circuit of claim 6, wherein during the first mode of operation, another portion of the gate current of the first series transistor reaches the control terminal through the gate terminal of the second series transistor.

8. The circuit of claim 6, wherein during the first mode of operation, another portion of the gate current of the first return transistor reaches a ground terminal through the gate terminal of the second return transistor.

9. The circuit of claim 6, wherein the control terminal comprises a first control terminal, and wherein during a second mode of operation:
 the second series transistor and the second return transistor are to be switched on, and the second shunt transistor is to be switched off;
 a gate current of the second series transistor reaches a second control terminal through a gate terminal of the second shunt transistor, and through a gate terminal of the first series transistor;
 a gate current of the second return transistor reaches the second control terminal through the gate terminal of the second shunt transistor, and through the gate terminal of the first return transistor; and
 a gate current of the first shunt transistor reaches the second control terminal through the gate terminal of the first series transistor, and through a gate terminal of the first return transistor.

10. A single-pole double-throw (SPDT) switch comprising:
 a first terminal, a second terminal and a third terminal, wherein the first terminal is configured to be selectively electrically coupled with the second terminal or, alternatively, with the third terminal;
 a series transistor electrically coupled between the first terminal and the second terminal, the series transistor configured to be controlled by a first control terminal;
 a shunt transistor electrically coupled between the second terminal and a first ground terminal, the shunt transistor configured to be controlled by a second control terminal; and
 a return transistor electrically coupled between the first ground terminal and a second ground terminal, the return transistor configured to be controlled by the first control terminal,
 wherein the first ground terminal is configured to provide reference for the second terminal and the second ground terminal is configured to provide reference for first terminal that is different than the reference for the second terminal.

11. The SPDT switch of claim 10, wherein the series transistor comprises a first series transistor, the shunt transistor comprises a first shunt transistor, and the return transistor comprises a first return transistor, the SPDT switch further comprising:
 a second series transistor electrically coupled between the first terminal and the third terminal, the second series transistor configured to be controlled by the second control terminal;

a second shunt transistor electrically coupled between the third terminal and a third ground terminal, the second shunt transistor configured to be controlled by the first control terminal; and a second return transistor electrically coupled between the third ground terminal and the second ground terminal, the second return transistor configured to be controlled by the second control terminal.

12. The SPDT switch of claim 11, wherein during a first mode of operation:

the first series transistor, the first return transistor, and the second shunt transistor are switched on; and the first shunt transistor, the second series transistor, and the second return transistor are switched off.

13. The SPDT switch of claim 12, wherein during the first mode of operation:

a gate current of the first series transistor reaches the second control terminal through a gate terminal of the first shunt transistor, and through a gate terminal of the second series transistor;

a gate current of the first return transistor is grounded through a gate terminal of the first shunt transistor, and through a gate terminal of the second return transistor; and a gate current of the second shunt transistor reaches the second control terminal through the gate terminal of the second series transistor, and through the gate terminal of the second return transistor.

14. The SPDT switch of claim 12, wherein during a first mode of operation, radio frequency signals are transmitted between the first terminal and the second terminal.

15. A method comprising:

switching on a series transistor in a series path and a return transistor in a return path; and switching off a shunt transistor in a shunt path;

wherein said switching on of the series transistor and return transistor and switching off of the shunt transistor provide:

a routing of a portion of a gate current of the series transistor to a ground terminal through a gate terminal of the shunt transistor; and a routing of a portion of a gate current of the return transistor to the ground terminal through the gate terminal of the shunt transistor.

16. The method of claim 15, wherein the series path comprises a first series path, the series transistor comprises a first series transistor, the shunt path comprises a first shunt path, the shunt transistor comprises a first shunt transistor, the return path comprises a first return path, and the return transistor comprises a first return transistor, the method further comprising:

operating a single-pole, plural-throw switch in a first mode of operation by said switching on of the first series transistor and first return transistor and switching off of the first shunt transistor; and operating the single-pole, plural-throw switch in a second mode of operation by:

switching on a second series transistor in a second series path and a second return transistor in a second return path; and switching off a second shunt transistor in a second shunt path;

wherein said switching on of the second series transistor and second return transistor and switching off of the second shunt transistor during the second mode of operation provide:

a routing of a portion of a gate current of the second series transistor to a ground terminal through a gate terminal of the first series transistor, and through a gate terminal of the second shunt transistor; and a routing of a portion of a gate current of the first return transistor to the ground terminal through the gate terminal of the second shunt transistor, and through a gate terminal of the first return transistor.

17. The method of claim 16, further comprising:

switching off the second series transistor and the second return transistor during the first mode of operation; and switching on the second shunt transistor during the first mode of operation;

wherein said switching off of the second series transistor and the second return transistor and switching on of the first shunt transistor during the first mode of operation provides:

a routing of a portion of the gate current of the first series transistor to the ground terminal through a gate terminal of the second series transistor; and a routing of a portion of a gate current of the second shunt transistor to the ground terminal through the gate terminal of the second series transistor, and through the gate terminal of the second return transistor.

18. The method of claim 16, further comprising:

controlling an operation of the first series transistor, the first return transistor, and the second shunt transistor by a first control terminal; and controlling an operation of the second series transistor, the second return transistor, and the first shunt transistor by a second control terminal.

19. The method of claim 15, further comprising:

introducing a first capacitor in the first series path to block the gate current of the first series transistor; and introducing a second capacitor in the first return path to block the gate current of the first return transistor.

* * * * *